United States Patent [19]
Chao

[11] Patent Number: 5,866,454
[45] Date of Patent: Feb. 2, 1999

[54] METHOD OF FABRICATING A CAPACITOR STRUCTURE FOR A DYNAMIC RANDOM ACCESS MEMORY CELL WITH CELLULAR VOIDS

[75] Inventor: Fang-Ching Chao, Hsinchu, Taiwan

[73] Assignee: United Microelectronics Corporation, Taiwan

[21] Appl. No.: 805,170

[22] Filed: Feb. 24, 1997

Related U.S. Application Data

[62] Division of Ser. No. 735,562, Oct. 23, 1996, Pat. No. 5,719,419.

[30] Foreign Application Priority Data

Aug. 16, 1996 [TW] Taiwan ................................ 85109996

[51] Int. Cl.$^6$ .............................................. H01L 21/8242
[52] U.S. Cl. .......................................... 438/254; 438/666
[58] Field of Search .................................. 438/253, 254, 438/396, 397, 666, 667

[56] References Cited

U.S. PATENT DOCUMENTS

| | | | |
|---|---|---|---|
| 5,071,783 | 12/1991 | Taguchi et al. | 438/254 |
| 5,077,688 | 12/1991 | Kumanoya et al. | 365/149 |
| 5,089,869 | 2/1992 | Matsuo et al. | 257/303 |
| 5,102,820 | 4/1992 | Chiba | 438/398 |
| 5,126,810 | 6/1992 | Gotou | 257/306 |
| 5,142,639 | 8/1992 | Kohyama et al. | 257/306 |
| 5,155,657 | 10/1992 | Oehrlein et al. | 257/298 |
| 5,158,905 | 10/1992 | Ahn | 438/396 |

(List continued on next page.)

FOREIGN PATENT DOCUMENTS

| | | |
|---|---|---|
| 0 516 031 A1 | 12/1992 | European Pat. Off. . |
| 4-26156 | 1/1992 | Japan . |
| 5-21745 A | 1/1993 | Japan . |
| 5-251657 | 9/1993 | Japan . |
| 6-151748 | 5/1994 | Japan . |
| 2 252 447 A | 8/1992 | United Kingdom . |

OTHER PUBLICATIONS

Mini–Trenches in Polysilicon for Dram Storage Capacitance Enhancement, IBM Technical Disclosure Bulletin, vol. 33, No. 9, Feb. 1991.

Ema et al., "3–Dimensional Stacked Capacitor Cell for 16M and 64M Drams", International Electron Devices Meeting, pp. 592–595, Dec. 1988.

Wakamiya et al., "Novel Stacked Capacitor Cell for 64Mb Dram", 1989 Symposium on VLSI Technology Digest of Technical papers, pp. 69–70.

*Primary Examiner*—Chandra Chaudhari
*Attorney, Agent, or Firm*—Rabin & Champagne, P.C.

[57] ABSTRACT

A structure and a method to increase the capacitance of a DRAM capacitor by forming a capacitor electrode with cellular voids to add surface area. According to the method: a transfer transistor with a gate electrode and source-drain electrode regions is formed on a semiconductor substrate. An insulating layer is formed on the semiconductor substrate and the transfer transistor, and the insulating layer is etched to form a contact void for exposing the surface of one of the source-drain electrode areas as a contact. A first conductive layer is formed on the insulating layer and is coupled to the contact through the contact void. On the first conductive layer, at least one middle insulating layer and one middle conductive layer are formed alternately to construct a multiple layer structure. Within the middle insulating layer(s), intercommunicating voids are formed through which the middle conductive layer is coupled to the first conductive layer is coupled to the first conductive layer. Thereafter, the middle conductive layer, the middle insulating layer and the first conductive layer are etched selectively to define an area of a capacitor. The middle insulating layer is removed by isotropic etching to form surface-increasing voids, and a cellular structure as a storage electrode is formed by the first conductive layer and the middle conductive layer. A dielectric layer is formed on the exposed surface of the storage electrode. A second conductive layer as an opposed electrode of the capacitor is then formed on the dielectric layer.

7 Claims, 9 Drawing Sheets

U.S. PATENT DOCUMENTS

| | | | |
|---|---|---|---|
| 5,164,337 | 11/1992 | Ogawa et al. | 438/254 |
| 5,172,201 | 12/1992 | Suizu | 257/308 |
| 5,196,365 | 3/1993 | Gotou | 438/254 |
| 5,206,787 | 4/1993 | Fujioka | 257/307 |
| 5,266,512 | 11/1993 | Kirsch | 438/253 |
| 5,274,258 | 12/1993 | Ahn | 257/308 |
| 5,338,955 | 8/1994 | Tamura et al. | 257/306 |
| 5,354,704 | 10/1994 | Yang et al. | |
| 5,371,701 | 12/1994 | Lee et al. | 257/306 |
| 5,389,568 | 2/1995 | Yun | 438/396 |
| 5,399,518 | 3/1995 | Sim et al. | 438/396 |
| 5,438,011 | 8/1995 | Blalock et al. | 438/396 |
| 5,443,993 | 8/1995 | Park et al | 438/396 |
| 5,453,633 | 9/1995 | Yun | 257/306 |
| 5,460,996 | 10/1995 | Ryou | 438/254 |
| 5,478,768 | 12/1995 | Iwasa | 438/253 |
| 5,478,770 | 12/1995 | Kim | 438/253 |
| 5,482,886 | 1/1996 | Park et al. | 438/397 |
| 5,508,222 | 4/1996 | Sakao | 438/396 |
| 5,521,419 | 5/1996 | Wakamiya et al. | 257/394 |
| 5,523,542 | 6/1996 | Chen et al. | 438/396 |
| 5,543,346 | 8/1996 | Keum et al. | 438/397 |
| 5,550,080 | 8/1996 | Kim | 438/397 |
| 5,561,309 | 10/1990 | Chao | 257/306 |
| 5,561,310 | 10/1996 | Woo et al. | 257/306 |
| 5,571,742 | 11/1996 | Jeong | 438/254 |
| 5,572,053 | 11/1996 | Ema | 257/308 |
| 5,595,931 | 1/1997 | Kim | 438/387 |

METHOD OF FABRICATING A CAPACITOR STRUCTURE FOR A DYNAMIC RANDOM ACCESS MEMORY CELL WITH CELLULAR VOIDS

This is a Division of application Ser. No. 08/735,562, now U.S. Pat. No. 5,719,419 filed Oct. 23, 1996.

BACKGROUND OF THE INVENTION

1. Field of the Invention

The invention relates in general to a method of fabricating semiconductor memory devices, and more particularly to a method of fabricating a DRAM cell by forming a capacitor electrode with cellular voids, to increase the capacitance by adding surface area.

2. Description of the Related Art

A dynamic random access memory (DRAM) is a widely used integrated circuit device, that presently plays an indispensable role in the electronics industry. FIG. 1 is a schematic diagram illustrating the circuit of a DRAM cell. As shown in FIG. 1, a memory cell consists of a transfer transistor T and a storage capacitor C. The source electrode of the transfer transistor T is coupled to a corresponding bit line BL, the drain electrode of the transfer transistor T is coupled to a storage electrode 6 of the storage capacitor and the gate electrode of the transfer transistor T is coupled to a corresponding word line WL. An opposed electrode 8 of the storage capacitor C is coupled to a fixed voltage source. A dielectric layer 7 is disposed between the storage electrode 6 and the opposed electrode 8. As known by those who are skilled in this art, the storage capacitor C used for storing data should have enough capacity to avoid the loss of data.

In a conventional process of fabricating a DRAM having a storage capacity of less than one mega-bits (1 MB), a two dimensional capacitance device, e.g. planar-type capacitor, is widely used for storing data. As shown in FIG. 2, where structures corresponding to those in FIG. 1 are designated with the same reference numbers, a field oxide layer 11 is formed on a substrate 10 to define an active region, and then a gate oxide layer 12, a gate electrode layer 13 and source-drain electrode regions 14 are formed in sequence to provide a transfer transistor T. On the surface of the substrate 10, which defines the storage electrode 6, a dielectric layer 7 and a conductive layer forming the opposed electrode 8 are formed adjacent to the drain electrode. The dielectric layer 7, the conductive layer 8 and the surface 6 of the substrate 10 where the layers 7 and 8 are formed, define a storage capacitor C. Obviously, a planar-type capacitor will occupy a fairly large area to form the storage capacitor C, which is inappropriate in a high integration DRAM.

Highly integrated DRAM, e.g. with a storage capacity of 4 MB and above, requires a three dimensional capacitance structure, such as in a "stack-type" capacitance device or a "trench-type" capacitance device, in order to realize its capacity.

FIG. 3 is a cross-sectional view of a conventional stack-type capacitance device, wherein structures corresponding to those in FIGS. 1 and 2 are designated by the same reference numbers. On a substrate 10, a field oxide layer 11, a gate oxide layer 12, a gate electrode layer 13 and source-drain electrode regions 14 are formed in sequence to construct a transfer transistor T. Next, an insulating layer 15 is formed, and a void is formed for a contact by etching the insulating layer above the source-drain electrode areas 14. Thereafter, a first polysilicon layer which is used as a storage electrode 6, a dielectric layer 7 and a second polysilicon layer which is used as an opposed electrode 8 are formed in sequence on the contact to complete a DRAM memory cell with the stack-type capacitor C. This memory cell can offer enough capacitance to assure the quality of device as the size of the device is diminished. However, when memory cells must be more highly integrated, such as in fabricating a DRAM with a storage capacity of 64 MB or greater, the above described simple structure of a stack-type capacitor is no longer appropriate.

FIG. 4 is a cross-sectional view of a conventional trench-type capacitor, wherein structures corresponding to those in FIGS. 1–3 are designated by the same reference numbers. First, a transfer transistor T is formed on a substrate 10 by an ordinary process, and includes a gate oxide layer 12, a gate electrode layer 13, and source-drain electrode regions 14. On the surface of the substrate 10, a deep trench is etched adjacent to the drain electrode. Next, within the deep trench, a storage capacitor C is formed. The storage capacitor C includes a dielectric layer 7, an opposed electrode 8 formed of a polysilicon layer, and a storage electrode 6 formed by the side wall of the substrate 10. This kind of capacitor structure can increase the surface area of the storage electrode, to raise the capacity of the capacitor. However, while the deep trench is being formed by etching, lattice defects are generated on the substrate, that increase leakage current and influence the characteristics of the device. Moreover, as the aspect ratio is increased, the etching rate is decreased, which adds difficulty to the process, and affects the efficiency of production.

SUMMARY OF THE INVENTION

It is therefore an object of the invention to provide a capacitor structure and a method of its fabrication wherein a capacitor electrode is formed with cellular voids to increase the capacitance by adding surface area, wherein the method is compatible with existing processes and is easy to perform.

The invention achieves the above-identified object, by providing a DRAM memory cell which includes a transfer transistor formed on a semiconductor substrate, an insulating layer covering the transfer transistor, and a storage capacitor electrically coupled to a contact through a contact void in the insulating layer. The transfer transistor at least includes a gate electrode and source-drain electrode regions. The insulating layer has a contact void for exposing the surface of one of the source-drain electrode areas as the contact. The storage capacitor includes a first conductive layer which is formed on the surface of the insulating layer and is coupled to the contact through the contact void. Over the insulating layer, the first conductive layer contains a plurality of surface-increasing voids. The surface-increasing voids are distributed horizontally to form a cellular structure to serve as the storage electrode of the storage capacitor. The dielectric layer is formed on the exposed surface of the first conductive layer with the cellular structure. A second conductive layer is formed on the dielectric layer to form the opposed electrode of the storage capacitor.

A method of fabricating this DRAM memory cell according to the invention includes forming a transfer transistor with a gate electrode and source-drain electrode regions, on a semiconductor substrate. An insulating layer is formed on the semiconductor substrate and the transfer transistor. The insulating layer is etched to form a contact void for exposing the surface of one of the source-drain electrode regions, the exposed surface to serve as a contact. A first conductive layer is formed on the insulating layer and is coupled to the contact through the contact void. On the first conductive layer, at least one middle insulating layer and one middle conductive layer are formed alternately to construct a multiple layer structure. Within the middle insulating layer, a plurality of intercommunicating voids are formed to provide therethrough, intercommunicating contacts between the middle conductive layer and the first conductive layer. Thereafter, the middle conductive layer, the middle insulating layer and the first conductive layer are etched selectively to define an area of a capacitor. The middle insulating layer is removed by isotropic etching to form a plurality of surface-increasing voids. A cellular structure is formed by the first conductor layer and the middle conductive layer to serve as a storage electrode. A dielectric layer is formed on the exposed surface of the storage electrode. Fabrication of the memory cell is then completed by forming a second conductive layer on the dielectric layer to act as an opposed electrode.

According to one of the preferred embodiments of the invention, formation of the middle insulator and the middle dielectric layer includes initially forming a first middle insulating layer on the first conductive layer. The first middle insulating layer is etched selectively to form a plurality of first intercommunicating voids. A first middle conductive layer is then formed on the insulating layer and coupled to the first conductive layer by first intercommunicating contacts through the first intercommunicating voids.

According to another preferred embodiment of the invention, after the above-mentioned steps, a second middle insulating layer is formed on the first middle conductive layer. A plurality of second intercommunicating voids are then formed by selectively etching the second middle insulating layer. A second middle conductive layer is formed on the second middle insulating layer and coupled to the first middle conductive layer by second intercommunicating contacts through the second intercommunicating voids.

BRIEF DESCRIPTION OF THE DRAWINGS

Other objects, features, and advantages of the invention will become apparent by way of the following detailed description of the preferred but non-limiting embodiments. The description is made with reference to the accompanying drawings in which.

DESCRIPTION OF THE PREFERRED EMBODIMENTS

FIRST EMBODIMENT

Figure 1:
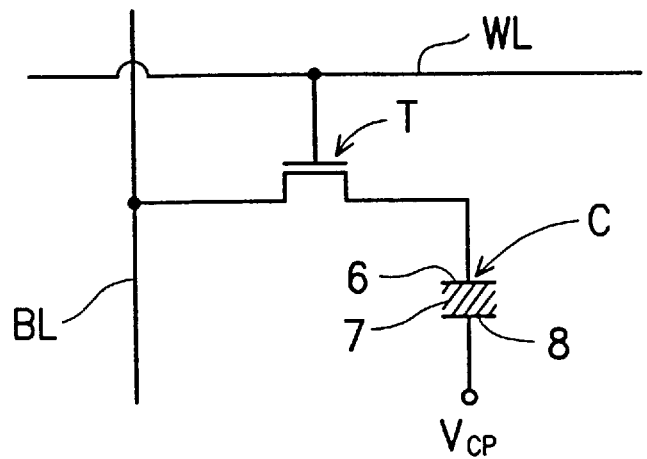
FIG. 1 is a schematic diagram illustrating the circuit of a conventional DRAM memory cell.
Figure 2:
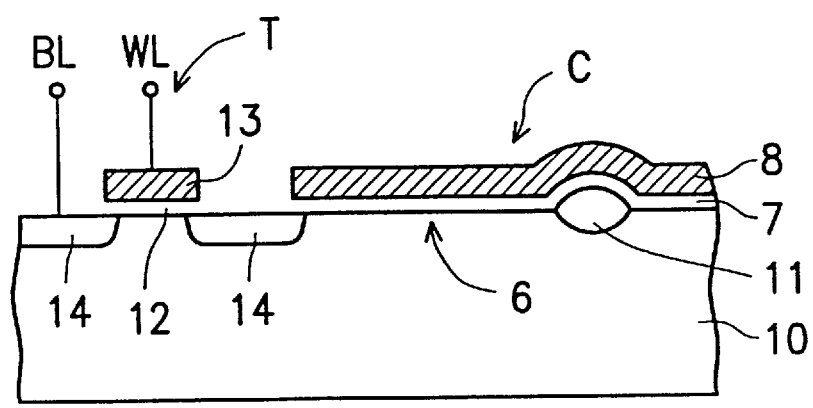
FIG. 2 is a cross-sectional view of a conventional DRAM memory cell with a planar-type capacitor.
Figure 3:
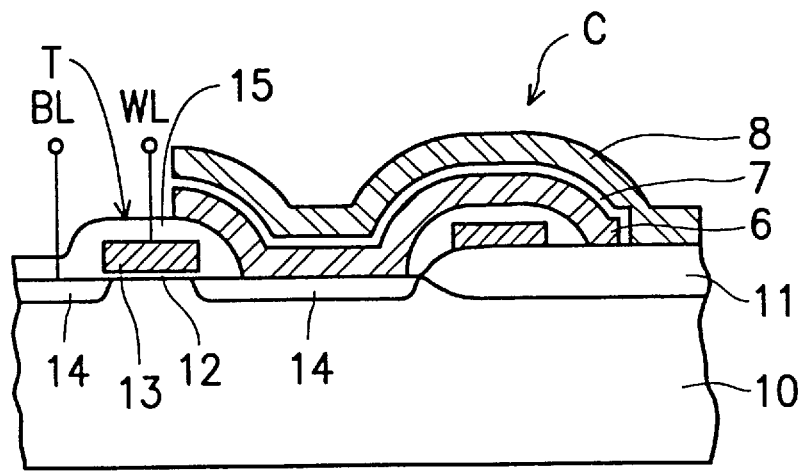
FIG. 3 is a cross-sectional view of a conventional DRAM memory cell with a stack-type capacitor.
Figure 4:
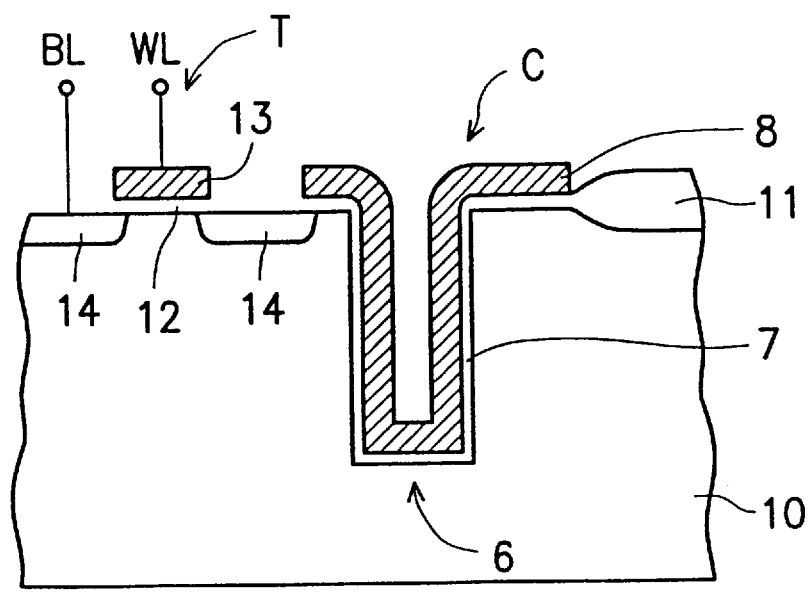
FIG. 4 is a cross-sectional view of a conventional memory cell with a trench-type capacitor.

As shown in FIG. 2, a field oxide layer is formed on a silicon substrate 10 to define the area of an active region. Next, a gate oxide layer 12, a polysilicon gate electrode layer 13 and a doped source-drain region 14 are formed in sequence to construct a transfer transistor T. Up to this point, the method of the invention is same as the conventional process. For the sake of simplification, the above mentioned structure is represented only by a flat substrate 20 in FIGS. 5A to 5E.

Figure 5A:
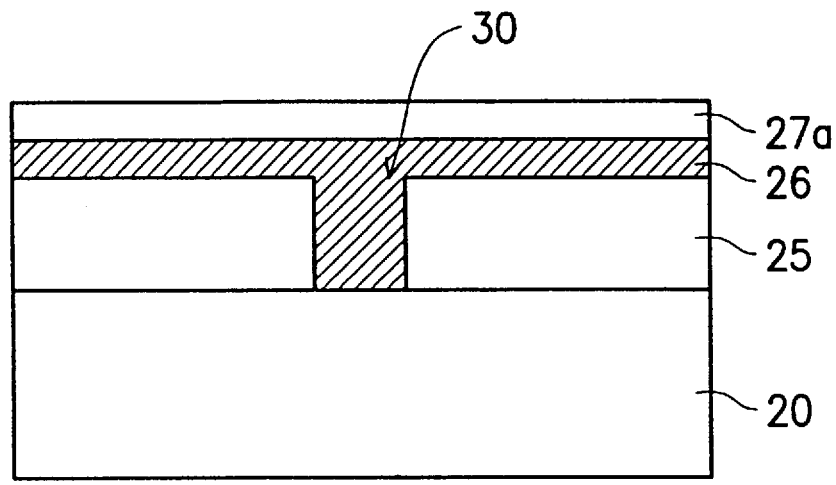
FIGS. 5A to 5E are cross-sectional views illustrating a process according to a preferred embodiment of the invention.

Referring to FIG. 5A, an insulating layer 25, e.g. an oxide layer, with a thickness between about 3000 and about 10,000 Å, is deposited by chemical vapor deposition (CVD). Defining the pattern of the insulating layer 25 by microlithography and etching, a contact void 30 is formed to expose the surface of one of the source-drain regions (not shown in FIGS. 5A–5E, see source drain area 14 in FIG. 2) to define a contact on the surface of the source/drain region. Thereafter, a polysilicon layer 26, with a thickness in the range of 200–1000 Å, is deposited on the surface of the insulating layer 25. The polysilicon layer 26 is coupled to the contact through the contact void 30. On the upper surface of the polysilicon layer 26, a middle insulating layer 27a, e.g. an oxide layer, with a thickness in the range of about 200–1000 Å, is deposited by CVD.

Figure 5B:
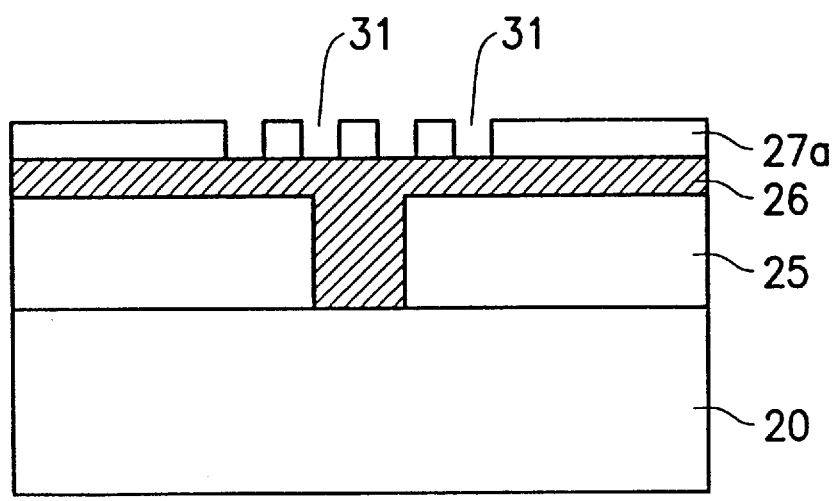
Figure 5C:
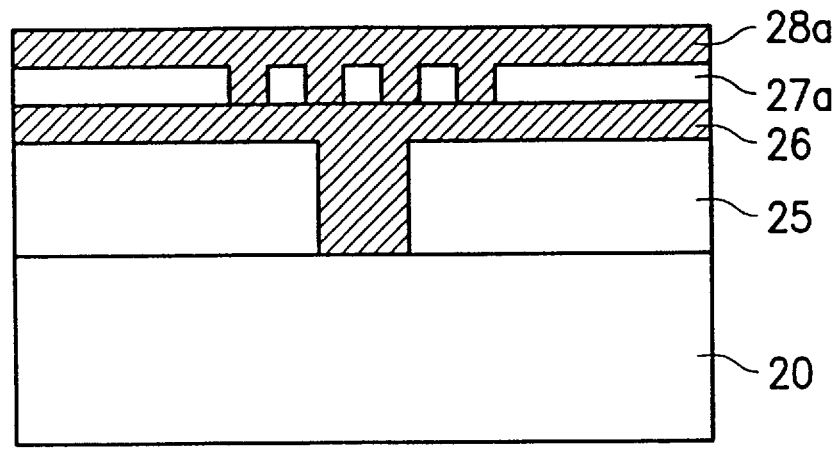

Referring to FIG. 5B, the pattern of the above-mentioned middle insulating layer 27a is defined by microlithography and etching to form a plurality of intercommunicating voids 31, by exposing parts of the polysilicon layer 26. Then, a middle conductive layer 28a, e.g. a polysilicon layer, with a thickness in the range of about 200–1000 Å, is deposited on the middle insulating layer 27a to obtain a structure as shown in FIG. 5C, wherein the middle conductive layer is coupled to the polysilicon layer 26 by intercommunicating contacts through the intercommunicating voids 31.

Figure 5D:
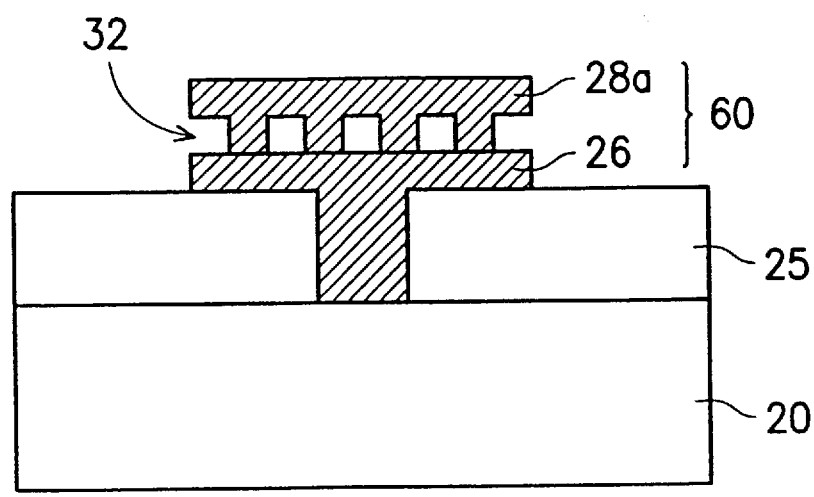

In FIG. 5D, using a photoresist mask (not shown), the middle conductive layer 28a, the middle insulating layer 27a and the polysilicon layer 26 are etched in sequence to define the area of a capacitor. After the photoresist is removed, all of the residual middle insulating layer 27a is removed by isotropic etching to leave a plurality of surface-increasing voids 32. The polysilicon layer 26 and the middle conductive layer 28a now form a cellular structure for a storage electrode 60 of a capacitor.

Figure 5E:
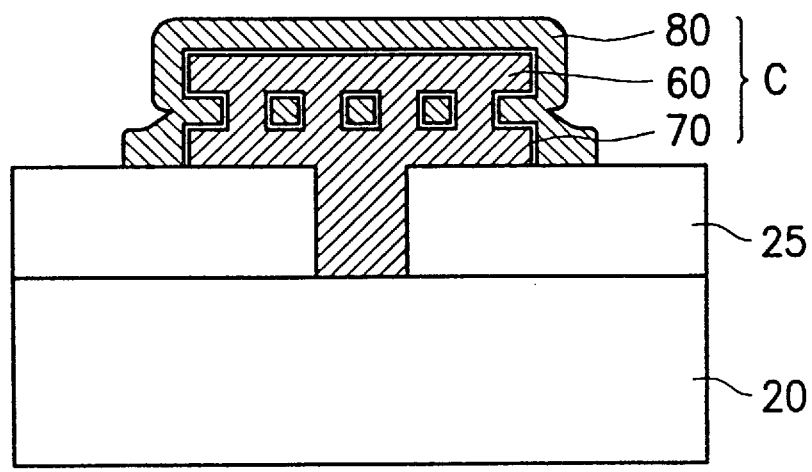

In FIG. 5E, a dielectric layer 70 is formed on the storage electrode 60, including the exposed surfaces of the surface-increasing voids 32. The dielectric layer can have a two layer structure, e.g. a silicon nitride/silicon dioxide layer structure (NO), or a three layer structure, e.g. a silicon dioxide/silicon nitride/silicon dioxide layer structure (ONO), or other materials such as tantalum oxide, barium titanic acid, or strontium titanic acid may be used. On the surface of the dielectric layer 70, an opposed electrode 80 is formed, including within the surface-increasing voids 32, thus completing the fabrication of the capacitor of the DRAM memory cell. For example, a polysilicon layer is deposited on the dielectric layer 70 to a thickness of about 1000 Å by CVD. The polysilicon layer can be implanted with impurities to increase its conductivity. Then, a pattern of the polysilicon layer is defined by microlithography and etching, to form the opposed electrode of the capacitor. Thus, the above mentioned storage electrode 60, the dielectric layer 70 and the opposed electrode 80 form a capacitor C.

Figure 6:
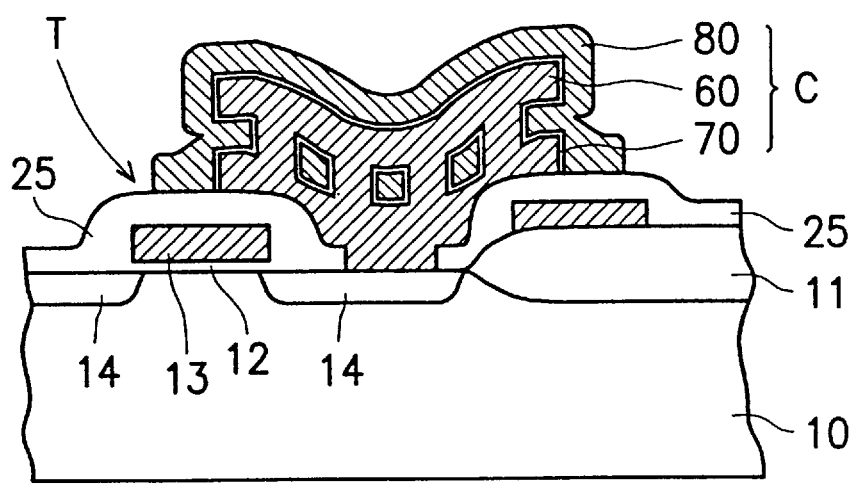
FIG. 6 is a cross-sectional view illustrating a DRAM memory cell fabricated according to the method of FIGS. 5A to 5E.

For the convenience of illustration and description, the semiconductor substrate 20 is shown flat in the figures. Thus, the uneven surface caused by the field oxide layer 11 and the polysilicon gate layer 13 are not shown in the figures. In considering the unevenness, reference is made to the structure of a DRAM memory cell according to the invention as shown in FIG. 6. It is apparent from FIGS. 5E and 6, that the cellular structure of the storage electrode 60 formed by the surface-increasing voids 32 can significantly increase its surface area, to provide more capacitance. Moreover, the increased surface area of the storage electrode is determined by the number of the surface-increasing voids 32. That is, the capacitance of the capacitor C can be adjusted by changing the pattern of the middle insulating layer 27a, which is a convenient feature for production.

SECOND EMBODIMENT

In the first embodiment, the surface-increasing voids 32 of the storage electrode 60 are distributed horizontally in one layer. However, the invention is not limited to having only one layer of surface-increasing voids. The surface-increasing voids can also be disposed in two, three, or more layers, to further increase the surface area. A process of fabricating a cellular capacitor with two layers of surface-increasing voids is described below.

Figure 7A:
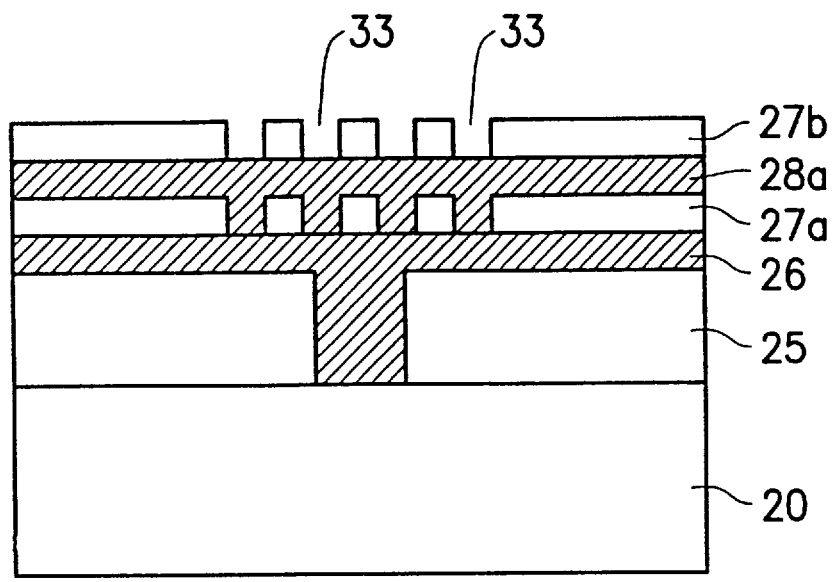
FIGS. 7A to 7D are cross-sectional views illustrating a process according to another preferred embodiment of the invention.

At first, the same steps performed for the first embodiment that are illustrated in FIGS. 5A to 5C, are performed. That is, an insulating layer 25, a polysilicon layer 26, a first middle insulating layer 27a and a first middle conductive layer 28a are formed in sequence on a substrate 20. The first middle conductive layer 28a is coupled to the polysilicon layer 26 by a plurality of intercommunicating contacts. As shown in FIG. 7A, a second middle insulating layer 27b, e.g. a silicon oxide layer, with a thickness between about 3000 Å and about 10,000 Å, is deposited on the surface of the first middle conductive layer 28a. Thereafter, the pattern of the second middle insulating layer 27b is defined by microlithography and etching, to form a plurality of further intercommunicating voids 33 for exposing a portion of the first middle conductive layer 28a.

Figure 7B:
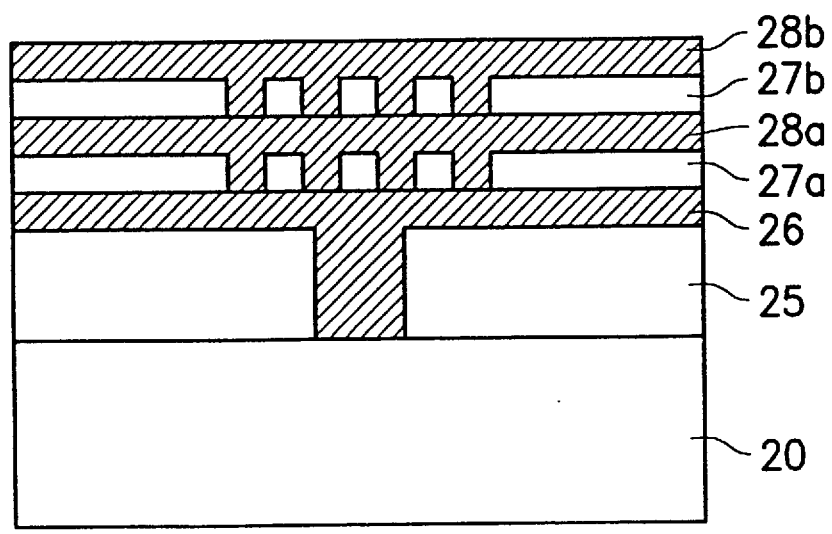

Next, referring to FIG. 7B, a second middle conductive layer 28b, e.g. a polysilicon oxide layer, with a thickness between about 200 and about 10,000 Å, is deposited on the surface of the second middle insulating layer 27b. The polysilicon layer 28b can be coupled to the first middle conductive layer 28a through the intercommunicating voids 33 by intercommunicating contacts.

Figure 7C:
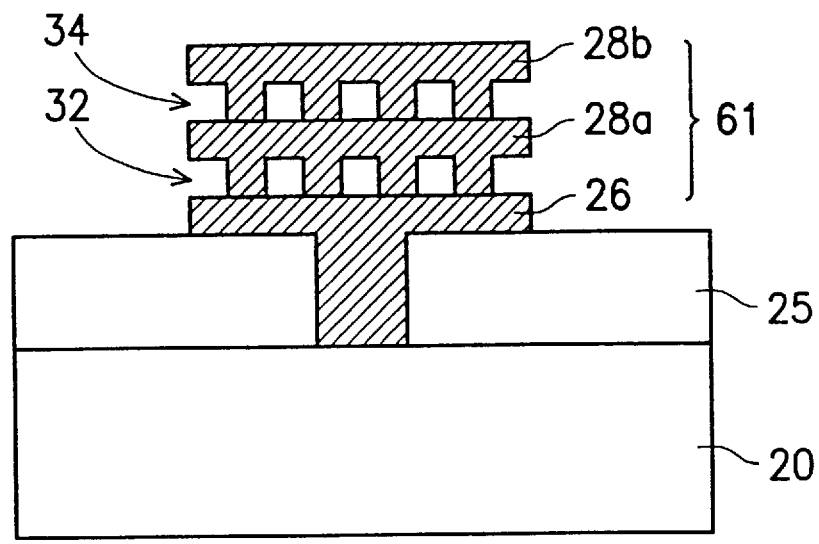

Referring to FIG. 7C, using a photoresist mask (not shown), the second middle conductive layer 28b, the second middle insulating layer 27b and the polysilicon layer 26 are etched in sequence to define the area of the capacitor. After removing the photoresist, all the residual portions of the first middle insulating layer 27a and the second middle insulating layer 27b are removed by isotropic etching to leave two layers of surface-increasing voids 32 and 34. The polysilicon layer 26, the first middle conductive layer 28a, and the second middle conductive layer 28b now form a cellular structure for a storage electrode 61 of a capacitor.

Figure 7D:
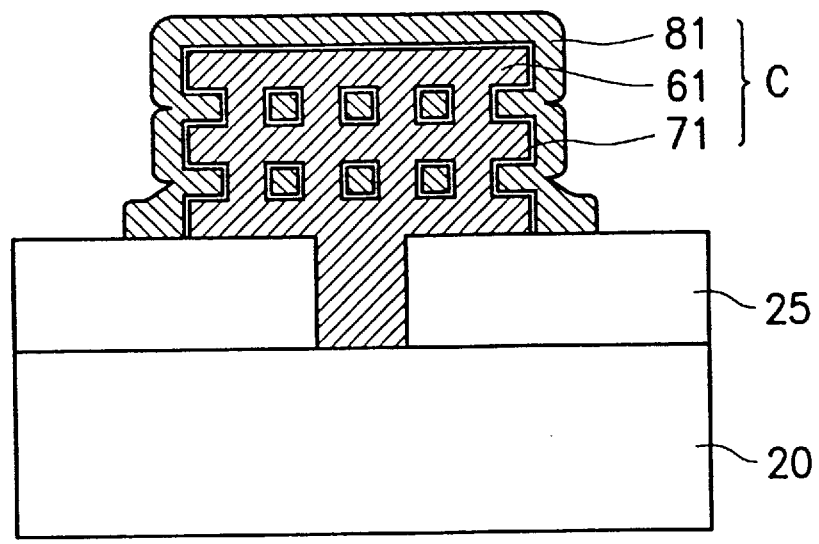

Referring to FIG. 7D, a dielectric layer 71 is formed on the exposed surface of the storage electrode 61, including the exposed surfaces of the surface-increasing voids 32 and 34. The dielectric layer 71 can be a two layer structure, e.g. a silicon nitride/silicon dioxide layer structure (NO), or a three layer structure, e.g. a silicon dioxide/silicon nitride/silicon dioxide layer structure (ONO), or a layer formed of other materials such as tantalum oxide, barium titanic acid, or strontium titanic acid. Another conductive layer 81 is formed on the surface of the dielectric layer 71, including within the surface-increasing voids 32 and 34. For example, a polysilicon layer is deposited to a thickness of about 1000 Å by CVD. Impurities may be implanted in the polysilicon layer to increase its conductivity. Then, the pattern of the polysilicon layer is defined by microlithography and etching, to form an opposed electrode 81 of the capacitor. Thus, the opposed electrode 81, the storage electrode 61 and the dielectric layer 71 form capacitor C.

Figure 8:
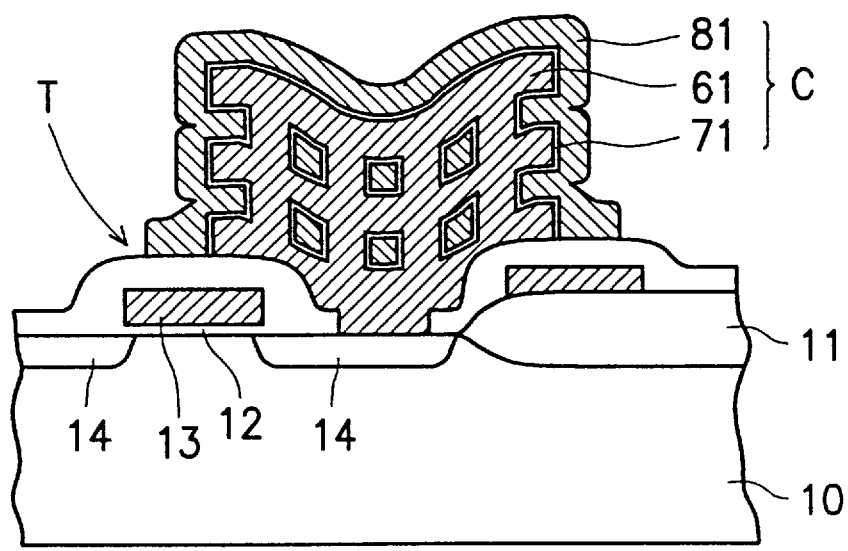
FIG. 8 is a cross-sectional view illustrating a DRAM memory cell fabricated according to the method of FIGS. 7A to 7D.

In FIGS. 7A to 7D, the substrate 20 is shown to be planarized in the same way as the embodiment of FIGS. 5A–5E. The unevenness of the substrate caused by the field oxide layer 11 and the polysilicon gate layer 13 on the substrate 20 in the DRAM memory cell fabricated according to the preferred embodiment, is shown in FIG. 8. Referring to FIGS. 7D and 8, it is apparent that the cellular structure which is formed by the surface-increasing voids 32 and 34 in the storage electrode 61, can significantly increase the surface area to provide more capacitance for the capacitor C. The increased capacitance provide by this embodiment is far larger than the increased capacitance of the first embodiment, which is advantageous for fabricating devices of diminished size.

While the invention has been described by way of example and in terms of preferred embodiments, it is to be understood that the invention is not limited to the disclosed embodiments. To the contrary, it is intended to cover various modifications and similar arrangements. For example, to those skilled in the art it will be apparent that the characteristics of the preferred embodiments can be used individually or simultaneously, to fabricate different kinds of storage electrodes. Many variations of the structure of the storage electrodes are contemplated. For example, although the drain regions of the transfer transistor in all the figures are in a diffusion area of the silicon substrate, the invention is not limited to this structure. Many other kinds of drain region structures can be used with the invention, such as a trench-type drain electrode. Therefore, the claims should be accorded the broadest interpretation so as to encompass all such modifications and similar structures.

What is claimed is:

1. A method of fabricating a DRAM cell, comprising:
   (a) forming a transfer transistor with a gate electrode and source-drain electrode regions, on a semiconductor substrate;
   (b) forming an insulating layer on the semiconductor substrate and the transfer transistor, and etching the insulating layer to form a contact void for exposing a contact on a surface of one of the source-drain regions;
   (c) forming a first conductive layer on the insulating layer, coupled to the contact through the contact void;
   (d) forming at least one middle insulating layer and at least one middle conductive layer alternating on the first conductive layer, to provide a multiple layer structure wherein, within the at least one middle insulating layer, a plurality of intercommunicating voids are formed so that the at least one middle conductive layer intercommunicates with the first conductive layer through the intercommunicating voids;
   (e) selectively etching the at least one middle conductive layer, the at least one middle insulating layers and the first conductive layer to define an area of a capacitor;
   (f) removing the at least one middle insulating area by isotropic etching, to form a plurality of surface-increasing voids and a cellular structure in the first conductive layer and the at least one middle conductive layer, as a storage electrode;
   (g) forming a dielectric layer on an exposed surface of the storage electrode; and
   (h) forming a second conductive layer on the dielectric layer as an opposed electrode.

2. A method of fabricating a DRAM cell according to claim 1, wherein forming at least one middle insulating layer and at least one middle conductive layer alternating on the first conductive layer includes:

(d1) forming a first middle insulating layer on the first conductive layer;

(d2) selectively etching the first middle insulating layer to form a plurality of first intercommunicating voids; and (d3) forming a first middle conductive layer on the first middle insulating layer and coupling the first middle conductive layer to the first conductive layer through the first intercommunicating voids.

3. A method of fabricating a DRAM cell according to claim 1, wherein forming at least one middle insulating layer and at least one middle conductive layer alternating on the first conductive layer further comprises, after coupling the first middle conductive layer to the first conductive layer through the first intercommunicating voids:

(d4) forming a second middle insulating layer on the first middle conductive layer;

(d5) selectively etching the second middle insulating layer to form a plurality of second intercommunicating voids; and (d6) forming a second middle conductive layer on the second middle insulating layer such that the second middle conductive layer is coupled to the first middle conductive layer through the second intercommunicating voids.

4. A method of fabricating a DRAM cell, comprising:

(a) forming a transfer transistor with a gate electrode and source-drain electrode regions, on a semiconductor substrate;

(b) forming an insulating layer on the semiconductor substrate and the transfer transistor, and etching the insulating layer to form a contact void for exposing a contact on a surface of one of the source-drain regions;

(c) forming a first conductive layer on the insulating layer, coupled to the contact through the contact void;

(d) forming a middle insulating layer directly on the first conductive layer;

(e) etching the middle insulating layer to form a plurality of intercommunicating voids that expose portions of the first conductive layer;

(f) forming a middle conductive layer directly on the middle insulating layer and in the plurality of intercommunicating voids, so that the middle conductive layer contacts the first conductive layer through the intercommunicating voids;

(g) selectively etching the middle conductive layer, the middle insulating layer, and the first conductive layer to define an area of a capacitor;

(h) removing the middle insulating area by isotropic etching, to form a storage electrode having a plurality of surface-increasing voids and a cellular structure in the first conductive layer and the middle conductive layer;

(i) forming a dielectric layer on an exposed surface of the storage electrode; and (j) forming a second conductive layer on the dielectric layer as an opposed electrode.

5. A method of fabricating a DRAM cell according to claim 4, wherein the middle insulating layer has a thickness in a range of about 200 Å and 1000 Å.

6. A method of fabricating a DRAM cell according to claim 4, wherein the middle conductive layer has a thickness in a range of about 200 Å and 1000 Å.

7. A method of fabricating a DRAM cell according to claim 4, further comprising, after forming a middle conductive layer on the middle insulating layer and in the plurality of intercommunicating voids:

(f1) forming a second middle insulating layer on the first middle conductive layer;

(f2) selectively etching the second middle insulating layer to form a plurality of second intercommunicating voids; and (f3) forming a second middle conductive layer on the second middle insulating layer such that the second middle conductive layer contacts the first middle conductive layer through the second intercommunicating voids.

* * * * *